(12) United States Patent
Asahi et al.

(10) Patent No.: US 6,989,059 B2
(45) Date of Patent: Jan. 24, 2006

(54) PROCESS FOR PRODUCING SINGLE CRYSTAL OF COMPOUND SEMICONDUCTOR AND CRYSTAL GROWING APPARATUS

(75) Inventors: Toshiaki Asahi, Toda (JP); Kenji Sato, Toda (JP); Takayuki Yabe, Toda (JP); Atsutoshi Arakawa, Kitaibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 0 days.

(21) Appl. No.: 10/497,916

(22) PCT Filed: Oct. 3, 2003

(86) PCT No.: PCT/JP03/12695

§ 371 (c)(1),
(2), (4) Date: Jun. 7, 2004

(87) PCT Pub. No.: WO2004/055249

PCT Pub. Date: Jul. 1, 2004

(65) Prior Publication Data

US 2005/0000403 A1   Jan. 6, 2005

(30) Foreign Application Priority Data

Dec. 18, 2002  (JP) ............................ 2002-367188

(51) Int. Cl.
*C30B 15/02* (2006.01)
*C30B 15/12* (2006.01)

(52) U.S. Cl. .................... 117/11; 117/217; 117/218; 117/222

(58) Field of Classification Search ................. 117/11, 117/217, 218, 222, 900
See application file for complete search history.

(56) References Cited

U.S. PATENT DOCUMENTS

| | | | |
|---|---|---|---|
| 5,047,112 A * | 9/1991 | Ciszek ........................ | 117/18 |
| 5,840,115 A * | 11/1998 | Taguchi et al. ............... | 117/18 |
| 6,447,602 B1 * | 9/2002 | Beswick ...................... | 117/18 |
| 2005/0118739 A1 * | 6/2005 | Asashi et al. ................. | 117/18 |

FOREIGN PATENT DOCUMENTS

| JP | 60-118699 A | 6/1985 |
|---|---|---|
| JP | 62-59598 A | 3/1987 |
| JP | 6-271395 A | 9/1994 |
| JP | 2004-099333 A | 4/2004 |

* cited by examiner

*Primary Examiner*—Felisa Hiteshew
(74) *Attorney, Agent, or Firm*—Birch, Stewart, Kolasch & Birch, LLP

(57) ABSTRACT

In a production method for producing a compound semiconductor single crystal by LEC method using a crystal growth apparatus with a double crucible structure, it was made to grow up a crystal by covering the second crucible with a plate-like member having a pass-through slot for being capable of introducing a crystal pulling-up shaft having a seed crystal holding part at a tip into the second crucible and creating a state where an atmosphere within the second crucible scarcely changes (a semi-sealed structure).

5 Claims, 2 Drawing Sheets

PROCESS FOR PRODUCING SINGLE CRYSTAL OF COMPOUND SEMICONDUCTOR AND CRYSTAL GROWING APPARATUS

TECHNICAL FIELD

The present invention relates to a production method of a compound semiconductor single crystal and a crystal growth apparatus, in particular, the present invention relates to a method for producing, for example, a ZnTe-based compound semiconductor single crystal by a liquid encapsulated Czochralski (LEC) method, and a useful technique applicable to the crystal growth apparatus.

DESCRIPTION OF RELATED ART

At present, a ZnTe-based compound semiconductor single crystal is expected as a crystal available for a pure green light-emitting device. Further, in recent years, devices for enhancing conductivity of the crystal have been made in order to further improve light emission properties as a light-emitting device. As for a method thereof, a method for adding impurities such as phosphorus or arsenic in the crystal has been carried out.

As for this method, there is used a growth method such as a vertical Bridgman (VB) method or a vertical gradient freezing (VGF) method, in which impurities can be added during the crystal growth.

However, in the production of the ZnTe-based compound semiconductor single crystal according to the VB method or the VGF method, a large-sized crystal can be grown but on the contrary, there often arises a problem that the crystal is cracked due to a difference in thermal expansion between an encapsulating material and a grown crystal because the crystal is grown by the cooling in a state of being covered with the encapsulating material.

Consequently, the present inventors have proposed a technique of growing a large-sized ZnTe-based compound semiconductor single crystal utilizing a liquid encapsulated Czochralski method (LEC method) in which impurities can be added during the crystal growth in the same manner as in the VB method or the VGF method (Japanese Patent Application Publication-Tokugan-2002-249963).

The above-described prior application technique is a technique of growing a crystal by the LEC method using a crystal growth apparatus with a double crucible structure, in which the crystal is grown while keeping a state where a surface of the grown crystal is covered with an encapsulating material until the crystal growth is completed, whereby evaporation of the constituent components from the surface of the grown crystal can be suppressed and deterioration in crystallinity of the grown crystal can be prevented, so that a single crystal having excellent quality can be grown.

Incidentally, in the prior application technique, the crystal is grown along an inner wall of the inner crucible, whereby the surface of the grown crystal can be covered with an encapsulating material until the completion of the crystal growth without using a large amount of the encapsulating material.

However, even if the surface of the grown crystal is covered with an encapsulating material, the constituent components of the grown crystal cannot be sufficiently prevented from being decomposed and the constituent components of the grown crystal may be evaporated.

Accordingly, the present invention is a technique applicable to the crystal growth method utilizing the LEC method, and the object of the present invention is to provide a production method of a compound semiconductor single crystal and a crystal growth apparatus, in which evaporation of the constituent components of the grown crystal can be easily prevented to grow a large-sized ZnTe-based compound semiconductor single crystal having excellent crystal quality.

DISCLOSURE OF INVENTION

In order to attain the above purpose of the invention,
a production method for producing a compound semiconductor single crystal, comprises: housing semiconductor raw materials and an encapsulating material in a raw material melt housing part composed of a bottomed cylindrical-shaped first crucible and a second crucible having a communicating opening with the first crucible at a bottom in a state of being disposed within the first crucible; covering the second crucible with a plate-like member to have provided a pass-through slot of enabling the introduction of a crystal pulling-up shaft having a seed crystal holding part at the end into the second crucible so as to create a state where an atmosphere within the second crucible scarcely changes; heating the raw material housing part to melt the raw materials and lowering the crystal pulling-up shaft to bring a seed crystal into contact with the surface of the raw material melt; and growing a crystal while raising the crystal pulling-up shaft (the so-called LEC method).

Herein, a state where an atmosphere within the second crucible scarcely changes is a state where the crucible is completely sealed or is considered to be almost sealed although a slight space is left, and it means a state where the constituent components in the atmosphere or a vapor pressure thereof scarcely changes.

According to this construction, the grown crystal is pulled up within the second crucible and the surface of the crystal is exposed from the encapsulating material along with the progress of the growth, however, the inside of the second crucible has an almost sealed structure, so that evaporation of the constituent components from the surface of the grown crystal can be effectively suppressed. Therefore, a high-quality compound semiconductor single crystal having no decomposition on the crystal surface can be produced. Further, impurities can be easily added during the crystal growth by use of the LEC method, so that a semiconductor device such as a light-emitting device having desired properties can be produced using a produced single crystal as a base body.

Incidentally, even in the general LEC method where a surface of the grown crystal is exposed from an encapsulating material along with the pulling-up of the grown crystal, evaporation of the constituent components of the grown crystal can be suppressed, so that a high-quality single crystal reduced in crystal defects can be produced.

Further, the plate-like member is fixed to the crystal pulling-up shaft so as not to slip off in a state of being inserted by the crystal pulling-up shaft, and is supported at the top end of the side wall of the second crucible to work out to a cover when the crystal pulling-up shaft is lowered.

According to this construction, the crystal pulling-up shaft can be surely and easily introduced into the second crucible through the plate-like member and moreover, the grown crystal can be easily taken out from the second crucible.

As another method, there is also considered, for example, a method where a plate-like member having provided thereon a pass-through slot is previously fixed on the upper part of the second crucible as a cover and a crystal pulling-up shaft is lowered from above the plate-like member so as to be introduced into the second crucible through the pass-through slot. However, according to the method, there is a possibility that unless the center of the pass-through slot and that of the crystal pulling-up shaft coincide with an appreciable accuracy, the crystal pulling-up shaft collides with the plate-like member, as a result, both are damaged. Further, it is also considered to increase the difference between the diameter of the pass-through slot and that of the crystal pulling-up shaft in anticipation of the deviation between the center of the pass-through slot and that of the crystal pulling-up shaft, however, there is a possibility that since the structure within the second crucible is widely different from the sealed structure, the constituent components of the grown crystal evaporates. Further, when a cover is fixed on the second crucible, the cover must be removed in taking out the grown crystal, which leads to reduction in productivity of the single crystal.

According to the present invention, there is no worry that such a problem arises and the second crucible can be easily allowed to have a semi-sealed structure. Further, along with the rise of the crystal pulling-up shaft, the plate-like member is also directly removed from the inner crucible, so that the grown crystal can be easily taken out.

Further, a crystal growth apparatus of the invention comprises at least: an outer vessel which can be sealed; a bottomed cylindrical-shaped first crucible disposed within the outer vessel; a second crucible having a communicating opening with the first crucible at the bottom in a state of being disposed within the first crucible; a crystal pulling-up shaft having a seed crystal holding part at the end; and a plate-like member which has a pass-through slot of enabling the introduction of the crystal pulling-up shaft into the second crucible and which works out to a cover of the second crucible.

According to such a crystal growth apparatus, the second crucible is almost sealed during the crystal growth, so that constituent components can be effectively prevented from evaporating from the surface of the grown crystal, as a result, a high-quality single crystal reduced in crystal defects can be produced.

Further, the plate-like member is previously inserted by the crystal pulling-up shaft which is provided with a slipping-off preventing member to prevent the plate-like member from slipping off. For example, the function as the slipping-off preventing member can be made to use also the seed crystal holding part fixed to a tip of the crystal pulling-up shaft.

Further, it is preferable that the plate-like member is a quartz glass plate. According to this construction, a possibility that the quality of the grown crystal deteriorates due to evaporation of the constituent components from the plate-like member decreases.

Further, by setting difference between the diameter of the pass-through slot provided on the plate-like member and the diameter of the crystal pulling-up shaft to 1 mm or less, the inside of the second crucible can have a semi-sealed structure effectively.

BEST MODE FOR CARRYING OUT THE INVENTION

The suitable embodiment of the present invention is described below by referring to drawings.

Figure 1:
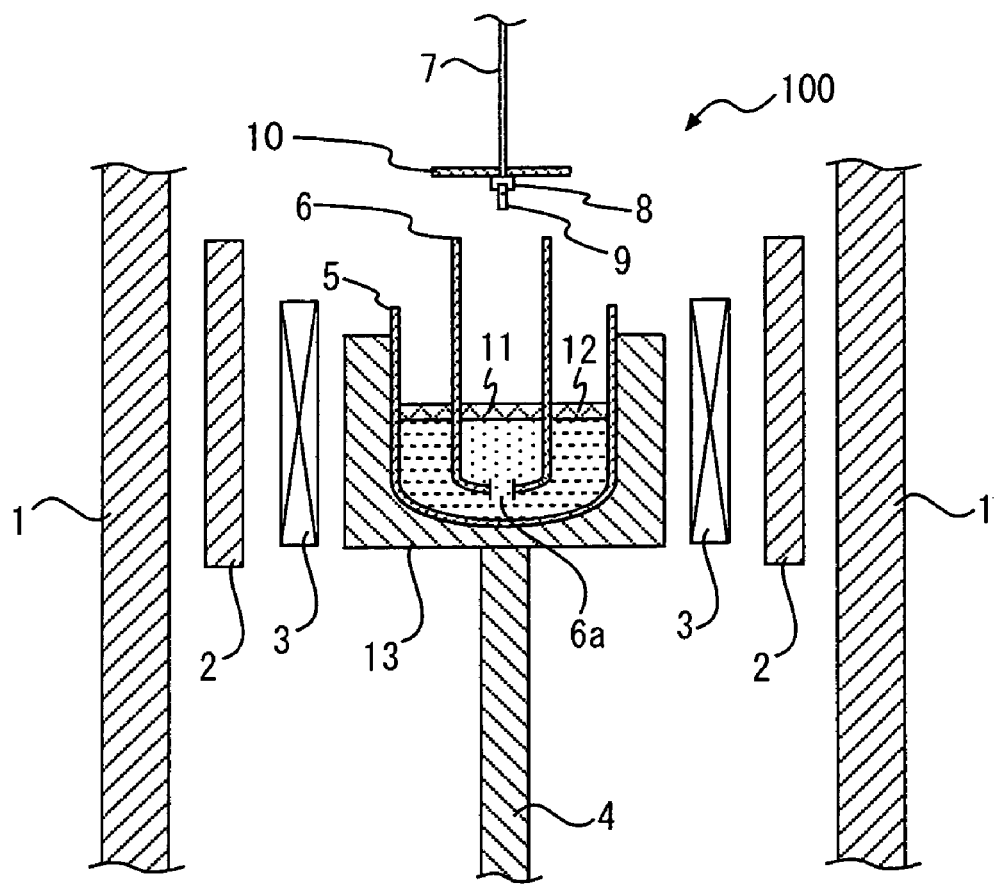
FIG. 1 is a schematic construction view of the crystal growth apparatus for use in the embodiment of the present invention.

FIG. 1 is a schematic construction view of the crystal growth apparatus according to the embodiment.

The crystal growth apparatus 100 of the embodiment is composed of a high-pressure vessel 1, a heat insulating material 2 and a heating heater 3 disposed concentrically with the high-pressure vessel in the inside of the vessel, a rotation shaft 4 disposed vertically in the central part of the high pressure vessel 1, a susceptor 13 disposed at the upper end of the rotation shaft 4, a bottomed cylindrical-shaped outer crucible (first crucible) 5 made of pBN and fitted into the susceptor, an inner crucible (second crucible) 6 made of pBN and disposed within the outer crucible 5, a rotary pulling-up shaft 7 vertically provided above the inner crucible 6 and provided with a seed crystal holder 8 fixing a seed crystal 9 at the lower end, and a quartz glass plate 10 inserted by the rotary pulling-up shaft 7 and held by the seed crystal holder 8 so as not to slip off.

The inner crucible 6 has a communicating opening 6a which communicates with the outer crucible 5 on the bottom surface so that a raw material melt 12 can move from the outer crucible 5 to the inner crucible 6 through the communicating opening. In addition, the inner crucible 6 is fixed to the outer crucible 5 or other jigs by an appropriate holder (not shown).

Further, the rotary pulling-up shaft 7 is connected to a driving unit (not shown) disposed outside the high-pressure vessel 1 to construct a rotary pulling-up mechanism. The rotation shaft 4 is connected to the driving unit (not shown) disposed outside the high-pressure vessel 1 to construct a crucible rotating mechanism and a susceptor lifting mechanism. The rotation and lifting movement motions of the rotary pulling-up shaft 7 and the crucible rotation shaft 4 each independently is set and controlled.

Further, a pass-through slot having a diameter slightly larger than that of the rotary pulling-up shaft 7 is provided in the center of the quartz glass plate 10 and the rotary pulling-up shaft 7 is inserted into the pass-through slot. It is desired, for example, that the difference between the diameter of the pass-through slot and that of the rotary pulling-up shaft 7 is adjusted to 1 mm or less. This is because when the diameter of the pass-through slot is made too large, a space between the rotary pulling-up shaft 7 and the quartz glass plate 10 is increased, as a result, a function of sealing the inner crucible 6 is reduced.

Using the above-described crystal growth apparatus, a single crystal rod grown from a seed crystal is pulled up with rotation so as to grow a high-purity single crystal at the lower end of the seed crystal by use of the liquid encapsulated Czochralski method.

Figure 2:
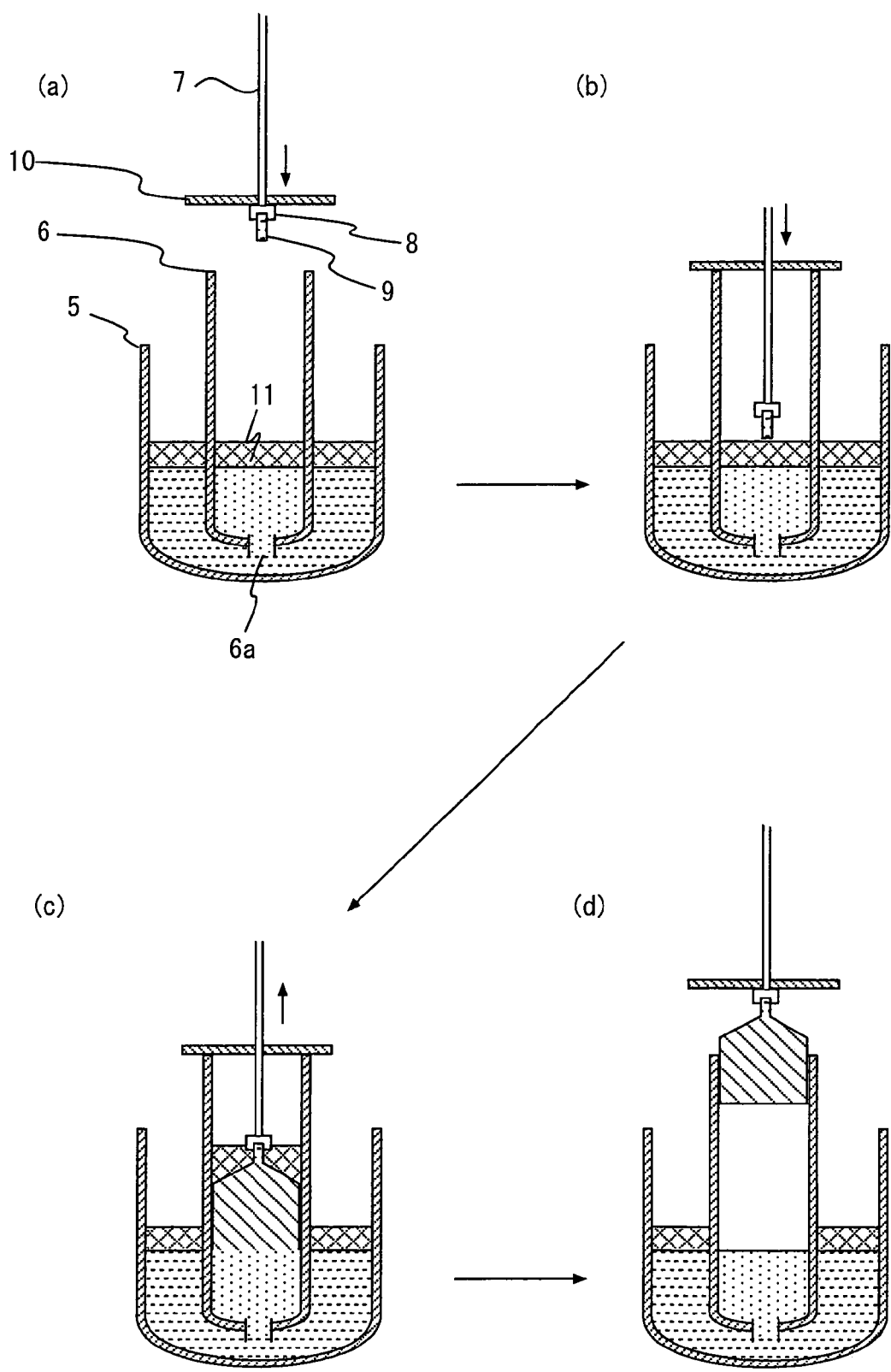
FIG. 2 is an explanatory view showing a growth process of a ZnTe compound semiconductor single crystal.

Next, a method for producing a ZnTe compound semiconductor single crystal as one example of compound semiconductors by use of the crystal growth apparatus 100 is described in detail. FIG. 2 is an explanatory view showing a growth process of the ZnTe compound semiconductor single crystal.

In the embodiment, a pBN crucible having a size of 100 mmφ in inner diameter×100 mm in height×1 mm in thickness was employed as the outer crucible 5, and a pBN crucible having a size of 54 mmφ in inner diameter×100 mm in height×1 mm in thickness was employed as the inner crucible 6. Further, a communicating opening 6a having a diameter of 10 mm is formed in the central part of the bottom surface of the inner crucible 6.

Further, a diameter of the rotary pulling-up shaft 7 was set to 12 mmφ and a diameter of the pass-through slot provided on the quartz glass plate 10 was set to 13 mmφ.

First, into the outer crucible 5 and the inner crucible, Zn with a purity of 6N and Te with a purity of 6N as raw materials were put in an amount of 1.5 kg in total such that Zn and Te were in an equimolar ratio, and the surface of the raw materials was covered with 400 g of an encapsulating material ($B_2O_3$) 11 so as to have an encapsulating material layer thickness of 35 mm.

Next, the outer crucible 5 and the inner crucible 6 were disposed on the susceptor 13, and the inside of the high-pressure vessel 1 was filled with an inactive gas (e.g., Ar) and adjusted so as to have a predetermined pressure. At this time, the inner crucible 6 was fixed by a holder so as to have a state where after the raw materials were melted by use of the heating heater 2, the inner crucible was dipped in the raw material melt in a depth of 20 mm from the liquid level.

Incidentally, the raw material melt was gradually decreased in quantity accompanying the crystal growth, however, the susceptor 13 (outer crucible 5) was raised by the lifting drive of the rotation shaft 4 to control a dipping state of the inner crucible 6. For example, the inner crucible 6 was held in a state of being dipped in the range of 10 mm to 40 mm from the liquid level of the raw material melt.

Thereafter, while sealing the surface of the raw materials with the encapsulating material, the inner crucible was heated at a predetermined temperature using the heating heater 2 to melt Zn and Te for the direct synthesis and held for a given length of time in a state where the raw materials were melted.

Next, as shown in FIG. 2(*a*), the rotary pulling-up shaft 7 holding the seed crystal 9 was lowered. At this time, the quartz glass plate 10 is lowered with the rotary pulling-up shaft because it is only supported by the seed crystal holder 8. Herein, a ZnTe crystal having a crystal orientation of (100) was used as the seed crystal. Further, the seed crystal was covered with a molybdenum cover (not shown) in order to prevent the seed crystal 9 from being decomposed.

Thereafter, as shown in FIG. 2(*b*), after the quartz glass plate 10 reached a sidewall of the inner crucible 6, only the rotary pulling-up shaft 7 was introduced into the inner crucible 6 because the quartz glass plate 10 was supported by the inner crucible 6.

Subsequently, the seed crystal was brought into contact with the surface of the raw material melt and then, the rotary pulling-up shaft 7 was rotated at a rotational speed of 1 to 2 rpm to form a shoulder part of the crystal while pulling up the crystal at a speed of 2.5 mm/h. Further, after the shoulder part of the crystal was formed, the crucible rotation shaft was rotated at a rotational speed of 1 to 5 rpm to form a body part of the crystal while pulling up the crystal at a speed of 2.5 mm/h. At this time, the diameter of the body part in the grown crystal 10 was almost the same as the inner diameter of the inner crucible 6 as shown in FIG. 2(*c*), so that a crystal having a desired diameter could be easily obtained without performing a precise diameter control according to the pulling-up speed and the rotational speed of the crucible or the pulling-up shaft.

After the completion of crystal growth, the crystal was cooled only for a predetermined time. Thereafter, the rotary pulling-up shaft 7 was raised to take out a grown crystal as shown in FIG. 2(*d*). At this time, the quarts glass plate 10 was raised with the support by the seed crystal holder 8, so that the grown crystal could be easily taken out.

As described above, the crystal growth according to the liquid encapsulated Czochralski method was performed and after the completion of the crystal growth, the grown crystal 10 was separated from the encapsulating material 11 to obtain a ZnTe compound semiconductor crystal having no crack. The obtained ZnTe compound semiconductor crystal had a glossy surface without having such surface decomposition that was found in a crystal grown by a usual LEC method. This is because the inner crucible 6 was sealed by the quartz glass plate 10 and therefore, the state of the atmosphere within the crucible scarcely changed, so that the decomposition and evaporation of the grown crystal could be prevented.

Further, the grown crystal had a size of 54 mmφ in diameter×60 mm in length, so that a large-sized ZnTe-based compound semiconductor single crystal conventionally regarded as difficult could be realized.

The invention carried out by the present inventors was described above in detail on the basis of the embodiment, however, the present invention is not limited to the embodiment.

For example, in the embodiment, the crystal was grown along the inner diameter of the inner crucible 6 so as to have a state where the surface of the grown crystal was covered with the encapsulating material, however, the present invention can be applied also in a general LEC method where the surface of the grown crystal is exposed from the encapsulating material with the pulling-up of the grown crystal, and evaporation of the constituent components of the grown crystal can be suppressed, so that a high-quality single crystal reduced in crystal defects can be produced.

Further, by adding impurities as a dopant in the raw material melt, conductivity of the crystal can be easily controlled. At this time, a difference is produced between the concentration of impurities in the raw material melt within the outer crucible 5 and the concentration of impurities in the raw material melt within the inner crucible 6, however, by changing the size of the communicating opening of the second crucible, the inner diameter of the second crucible, the difference between the concentrations of impurities in the raw material melts is controlled, as a result, the concentration of impurities in the raw material melt within the inner crucible 6 can be kept constant.

According to the present invention, semiconductor raw materials and an encapsulating material are housed in a raw material melt housing part composed of a bottomed cylindrical-shaped first crucible and a second crucible having a communicating opening with the first crucible at the bottom in a state of being disposed within the first crucible, the second crucible is covered with a plate-like member having provided thereon a pass-through slot of enabling the introduction of a crystal pulling-up shaft having a seed crystal holding part at the end into the second crucible so as to create a state where an atmosphere within the second crucible scarcely changes, the raw material housing part is heated to melt the raw materials and the crystal pulling-up shaft is lowered to bring a seed crystal into contact with the surface of the raw material melt, and a crystal is grown while raising the crystal pulling-up shaft, so that the inside of the second crucible where the crystal growth is performed has a semi-sealed structure, as a result, the evaporation of the constituent components from the surface of the grown crystal can be effectively suppressed.

Accordingly, when growing a crystal using the LEC method, a high-quality single crystal reduced in crystal defects can be produced. Further, impurities can be easily added during the crystal growth by the LEC method, so that a semiconductor device such as a light-emitting device having desired properties can be produced using the produced single crystal.

INDUSTRIAL APPLICABILITY

The present invention is effective in producing not only a ZnTe compound semiconductor single crystal but also a ternary or more ZnTe-based compound semiconductor single crystal containing ZnTe or other compound semiconductor single crystals. By applying the present invention, a large-sized and high-quality compound semiconductor single crystal can be obtained.

What is claimed is:

1. A method for producing a compound semiconductor single crystal, comprising:
   providing semiconductor raw materials and an encapsulating material in a raw material melt housing comprising a closed-bottomed cylindrically-shaped first crucible and a second crucible having an open top portion and an opening in a bottom portion thereof communicating with the interior of said first crucible and said second crucible being disposed within the first crucible;
   covering said open top portion of the second crucible with a cover having an opening therein,
   heating the raw material housing to melt the raw materials, lowering a shaft through said opening in said cover of said second crucible to bring a seed crystal attached thereto into contact with the raw material melt in said first crucible, said second crucible being substantially sealed during said contacting by said cover; and
   growing a crystal while raising said shaft from said raw material melt, wherein the cover is fixed to said shaft, and said cover is supported at a top end of a side wall of the second crucible when the crystal pulling-up shaft is lowered.

2. A crystal growth apparatus comprising:
   an outer vessel which is sealable;
   a closed-bottomed cylindrical-shaped first crucible disposed within the outer vessel;
   a second crucible having an opening in a bottom portion thereof permitting communication between an interior of said second crucible and an interior of said first crucible, said second crucible being disposed within said first crucible,
   a shaft having a seed crystal holding means at an end portion thereof; and
   a cover for covering the top of said second crucible and having an opening therein adapted to permit said shaft to pass through said opening in said cover,
   wherein said shaft includes means to engage said cover to prevent said shaft from being pulled completely from said opening in said cover.

3. The crystal growth apparatus as claimed in claim 2, wherein the cover is a quartz glass plate.

4. The crystal growth apparatus as claimed in claim 2, wherein a difference between the diameter of said opening in said cover and the diameter of said shaft is 1 mm or less.

5. The crystal growth apparatus as claimed in claim 3, wherein a difference between a diameter of said opening in said cover and the diameter of shaft is 1 mm or less.

* * * * *